(12) United States Patent
Godet et al.

(10) Patent No.: US 9,336,998 B2
(45) Date of Patent: May 10, 2016

(54) APPARATUS AND METHOD FOR DYNAMIC CONTROL OF ION BEAM ENERGY AND ANGLE

(71) Applicant: Varian Semiconductor Equipment Associates, Inc., Gloucester, MA (US)

(72) Inventors: Ludovic Godet, Sunnyvale, CA (US); Daniel Distaso, Merrimac, MA (US); Nini Munoz, Ithaca, NY (US); Tristan Ma, Lexington, MA (US); Yu Liu, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/274,018

(22) Filed: May 9, 2014

(65) Prior Publication Data
US 2015/0325410 A1    Nov. 12, 2015

(51) Int. Cl.
| H01L 21/20 | (2006.01) |
| H01J 37/32 | (2006.01) |
| H01L 43/12 | (2006.01) |
| C23C 14/54 | (2006.01) |
| C23C 14/34 | (2006.01) |

(52) U.S. Cl.
CPC ....... *H01J 37/32146* (2013.01); *C23C 14/3485* (2013.01); *C23C 14/54* (2013.01); *H01L 43/12* (2013.01); *H01J 2237/3343* (2013.01)

(58) Field of Classification Search
CPC ...... H01L 21/20; H01L 21/306; H01L 21/364
USPC ..................................... 438/264, 508; 257/76
See application file for complete search history.

(56) References Cited

U.S. PATENT DOCUMENTS

| 6,350,390 | B1* | 2/2002 | Liu et al. .......................... 216/59 |
| 7,586,100 | B2 | 9/2009 | Raj et al. |
| 7,767,977 | B1 | 8/2010 | Godet et al. |
| 7,878,145 | B2 | 2/2011 | Fang et al. |
| 8,101,510 | B2 | 1/2012 | Godet et al. |
| 8,188,445 | B2 | 5/2012 | Godet et al. |
| 8,288,741 | B1 | 10/2012 | Miller et al. |
| 2010/0096568 | A1 | 4/2010 | Abarra et al. |
| 2011/0255773 | A1* | 10/2011 | Takahashi et al. ............ 382/145 |
| 2012/0104274 | A1 | 5/2012 | Hirayanagi et al. |
| 2013/0084530 | A1 | 4/2013 | Huang et al. |
| 2013/0146997 | A1* | 6/2013 | Lee et al. ...................... 257/427 |
| 2014/0113450 | A1* | 4/2014 | Uda et al. ...................... 438/694 |

FOREIGN PATENT DOCUMENTS

| WO | 2007124294 A2 | 11/2007 |
| WO | 2009028743 A1 | 3/2009 |

OTHER PUBLICATIONS

International Search Report and Written Opinion mailed Aug. 26, 2015, in corresponding PCT/US2015/030079.

* cited by examiner

*Primary Examiner* — Phuc Dang

(57) ABSTRACT

In one embodiment a method of etching a substrate includes directing a first ion beam to the substrate through an extraction plate of a processing apparatus using a first set of control settings of the processing apparatus. The method may further include detecting a signal from the substrate that indicates a change in material being etched by the first ion beam from a first material to a second material, adjusting control settings of the processing apparatus to a second set of control settings different from the first set of control settings based on the second material, and directing a second ion beam to the substrate through the extraction plate using the second set of control settings.

18 Claims, 10 Drawing Sheets

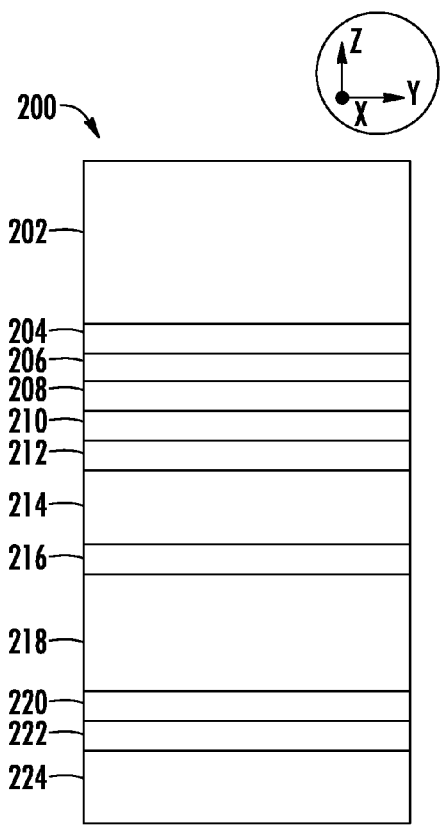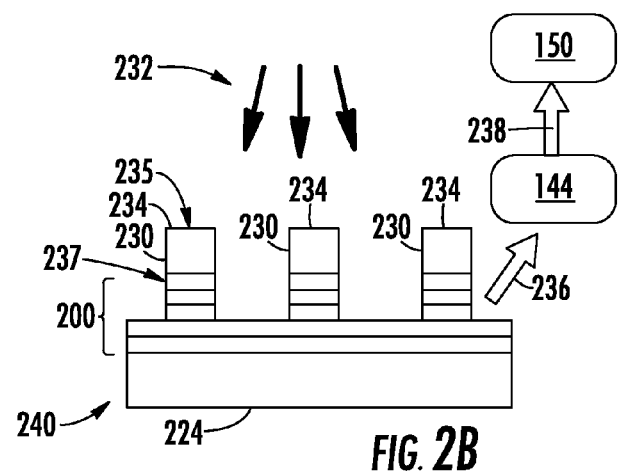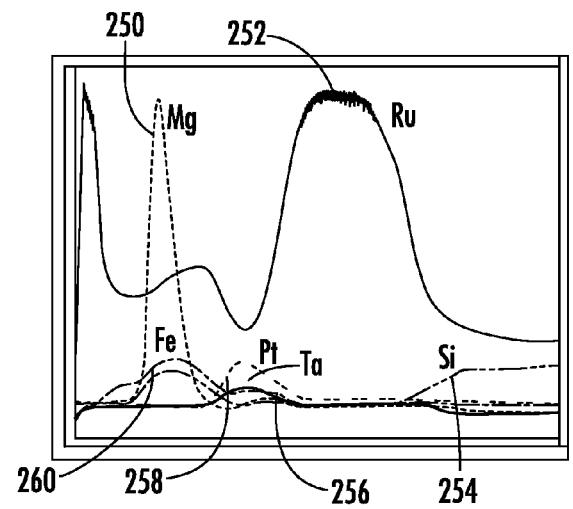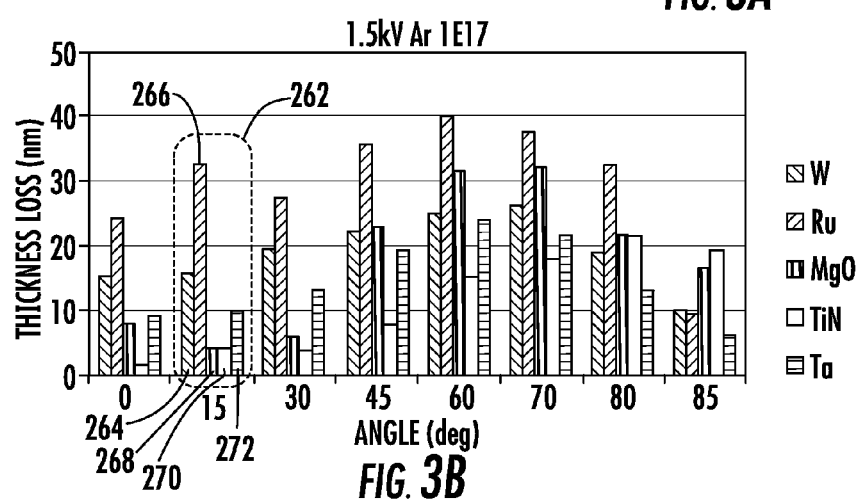

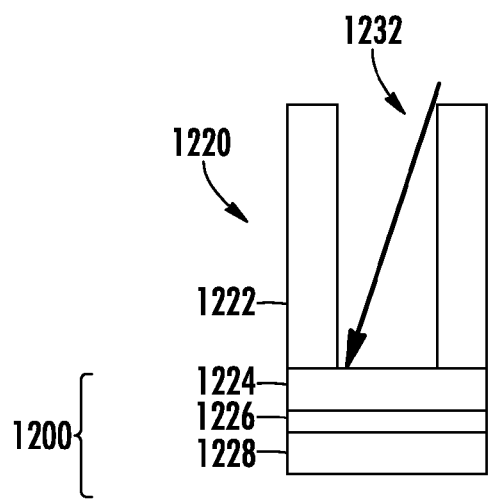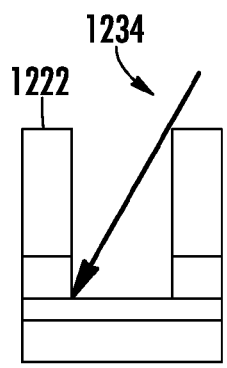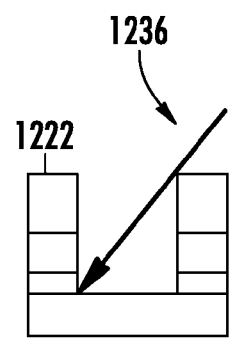
FIG. 12A          FIG. 12B          FIG. 12C
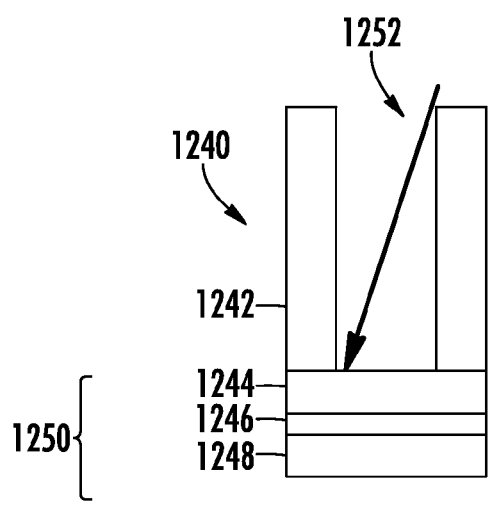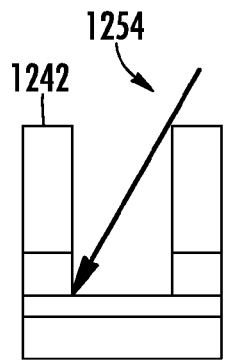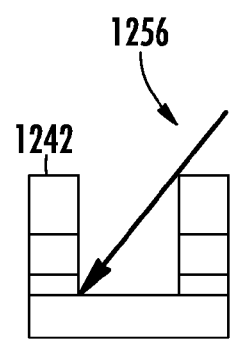
FIG. 12D          FIG. 12E          FIG. 12F

APPARATUS AND METHOD FOR DYNAMIC CONTROL OF ION BEAM ENERGY AND ANGLE

FIELD

The present embodiments relate to substrate etching using an ion beam and more particularly to etching a multilayer substrate to produce patterned structures.

BACKGROUND

The fabrication of many present day devices often entails etching of multiple layers to define device features. For example, some memory devices such as magnetic random access memory (MRAM) or other advanced memory devices are fabricated from a layer stack that includes multiple different materials in the different layers, including metals or metal alloys. Etching of such a layer stack suffers from many challenges due to the presence of non-volatile material within the layer stack such as Co, Pt or Fe. Because of the non-volatile nature of such material, the etching process for patterning an MRAM layer stack mainly relies on physical etching mechanisms.

After a patterned mask material that is used to define MRAM cells is formed on a substrate, the mask etch rate may be similar to that of the exposed layer stack materials, resulting in significant erosion of the mask. This limits the thickness of a layer stack that can be etched for a given mask thickness. For example 90 nm TiN or W may be used as a hard mask for etching of a 30 nm MRAM layer. In addition, material that is etched from the layer stack including metallic material may be redeposited on sidewalls of patterned features being formed, such as memory cells, leading to an increase in critical dimension of a cell, for example, from 25 nm to 40 nm. Metal residue may form at the edge of a recess oxide due to ion knock-on/mixing during etching, leading to shorting between metal layers. Moreover, lack of abruptness and sidewall damage in such cells may degrade performance in MRAM devices to be formed.

Current attempts to address these problems include the use of multiple angle ion etching to improve profile abruptness of patterned features and reduce redeposition. However, this may involve time based etching, which is not a robust process that can account for variation in layer stack thickness or etch rate drift with time. It is with respect to these and other considerations that the present embodiments may be needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of etching a substrate includes directing a first ion beam to the substrate through an extraction plate of a processing apparatus using a first set of control settings of the processing apparatus. The method may further include detecting a signal from the substrate that indicates a change in material being etched by the first ion beam from a first material to a second material, adjusting control settings of the processing apparatus to a second set of control settings different from the first set of control settings based on the second material, and directing a second ion beam to the substrate through the extraction plate using the second set of control settings.

In another embodiment, a method of etching a device structure includes providing a substrate comprising a layer stack disposed on a substrate base, the layer stack having a multiplicity of layers that includes at least one metal layer, and a mask having plurality of mask features disposed on the layer stack, and directing a first ion beam to the layer stack through an extraction plate of a processing apparatus using a first set of control settings of the processing apparatus. The method may further include detecting an optical emission spectroscopy (OES) signal from the layer stack that indicates a change in material being etched in the layer stack from a first material to a second material, adjusting control settings of the processing apparatus to a second set of control settings different from the first set of control settings based on the second material, and directing a second ion beam to the layer stack through the extraction plate using the second set of control settings.

In a further embodiment, a processing apparatus includes a plasma source to generate a plasma in a plasma chamber, an extraction plate disposed along a side of the plasma chamber, the extraction plate having an aperture configured to direct an ion beam to a substrate when a bias is applied between the plasma chamber and substrate, and a monitoring apparatus to measure a signal from the substrate. The processing apparatus may also include at least one computer-readable storage medium comprising instructions that, when executed, cause the processing apparatus to identify a first signal from the substrate that indicates a change in material from a first material to a second material when the first ion beam is directed to the substrate, to adjust control settings of the processing apparatus to a second set of control settings different from the first set of control settings based on the second material, and direct a second ion beam to the layer stack through the extraction plate using the second set of control settings.

BRIEF DESCRIPTION OF THE DRAWINGS

FIG. 2A depicts a side view of an exemplary MRAM layer stack;

FIG. 2B depicts etching an MRAM structure according to one embodiment;

FIG. 3A illustrates use of an OES signal to monitor etching of a layer stack;

FIG. 3B depicts sputter rate as a function of ion incidence angle for various materials;

FIGS. 12A-12C present a pictorial representation of one scenario for implementing the process flow of FIG. 10; and FIGS. 12D-12F present a pictorial representation of one scenario for implementing the process flow of FIG. 11.

DETAILED DESCRIPTION

Figure 1A:
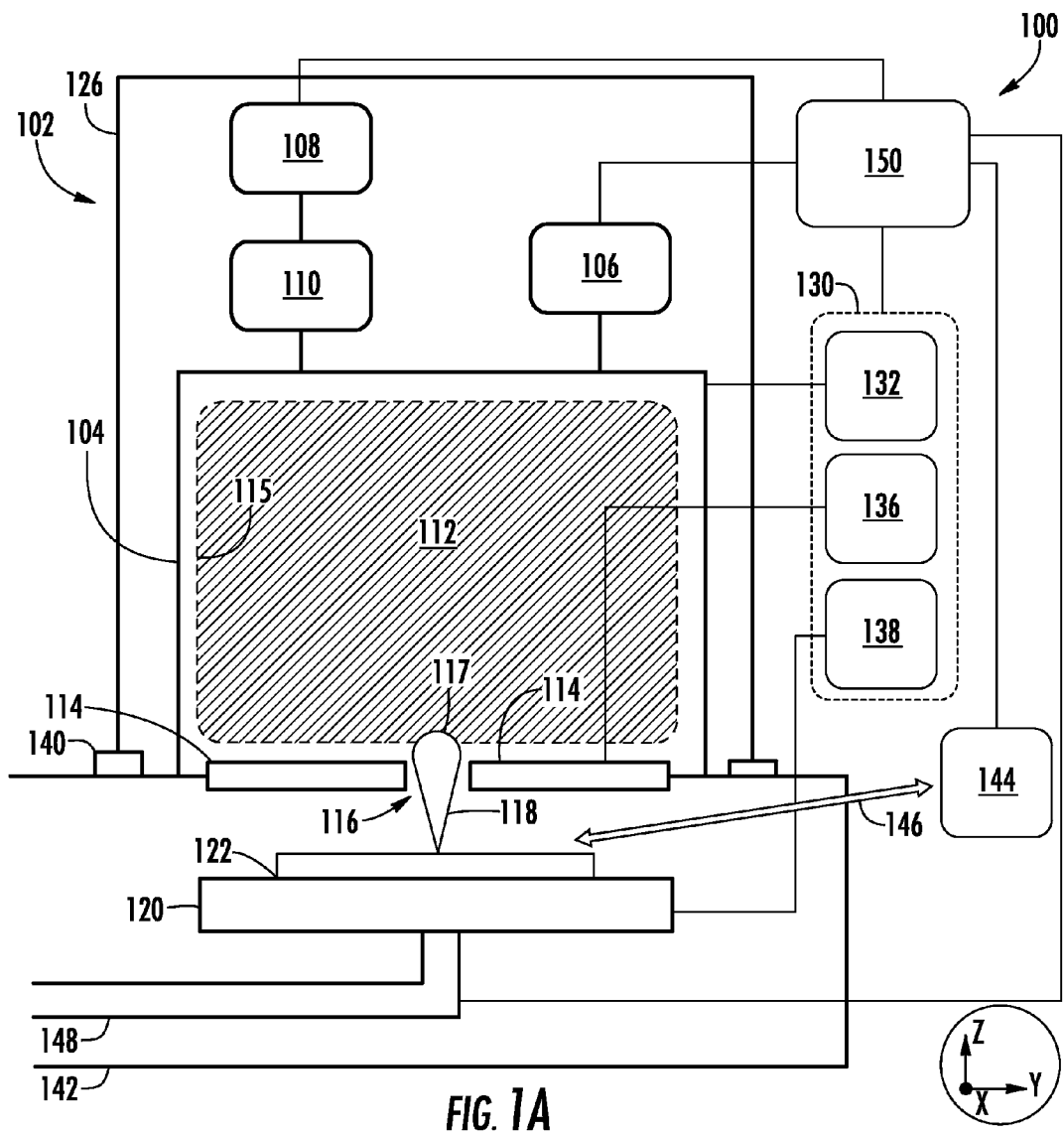
FIG. 1A depicts a side view of a processing apparatus according to one embodiment.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide apparatus and methods for dynamically etching a substrate. In particular, the present embodiments provide novel methods and apparatus to produce etched structures within a stack of layers, referred to herein as a "layer stack," that are disposed on a substrate base. The layer stack may be partially covered with a mask that comprises a set of patterned features used to define the pattern of structures to be etched into the layer stack. The present embodiments are suitable for etching a layer stack that includes at least one metal layer, such as layer stacks used to form MRAM devices or similar devices. However the present embodiments may be employed for etching other multilayer structures in which ion beam etch conditions are dynamically adjusted during etching. In various embodiments etching of a layer stack is performed using a dynamic etching process that employs an ion beam extracted from a plasma chamber to sputter etch multiple layers of the layer stack. In accordance with the present embodiments, control settings of a processing apparatus are dynamically adjusted to tailor characteristics of an ion beam according to the physical and/or chemical properties of a layer being etched.

In this manner, the structure of an MRAM layer stack, including abruptness and sidewall damage, may be improved by controlling incidence angle and energy of incident ions of an ion beam according to the layer being etched within a layer stack of the MRAM device to be formed. This may be particularly useful since different metal layers of a layer stack may have different sputtering yields both as a function of ion energy and ion incidence angle, and may differ in their redeposition rate on an MRAM structure being formed because of different sticking coefficients. For example, for a metal layer that is harder to etch the present embodiments may dynamically adjust ion beam energy to a higher energy and a larger incidence angle, while for a metal layer that is easier to etch the ion beam may be dynamically switched to a lower energy and lower incidence angle.

In various embodiments a monitoring apparatus and method are used to determine in real time when etching of a first layer is complete, or when etching of a second layer adjacent the first layer is commencing, or a combination of the two. In this manner, a determination may be made as to when to adjust control settings of a processing apparatus that generates the ion beam used for the etching.

The monitoring apparatus of the present embodiments may be an optical emission spectroscopy (OES) device as generally known in the art. The monitoring apparatus may alternatively be a reflectometry device that measures surface reflectivity of a substrate being etched, which may vary among different layers. However, the embodiments are not limited in this context. Such monitoring apparatus may be generally referred to herein as "endpoint detection" apparatus, although in the present embodiments, the "endpoint" that is detected may indicate the transition from a first layer to a second layer during etching, and may be used to adjust ion beam conditions used to perform an etch, rather than to terminate etching completely. Accordingly, in various embodiments an OES signal emitted from a process chamber where a layer stack is being etched may be used as a feedback to indicate in real time when etching of a given layer of a layer stack commences or etching of a layer adjacent the given layer is ending, so that control settings of a processing apparatus are adjusted to tailor the ion beam incidence angle, ion energy or other parameters for etching the given layer.

FIG. 1A depicts a side view of a processing apparatus 100 consistent with embodiments of this disclosure. Processing apparatus 100 includes a plasma source 102 to generate a plasma 112 in a plasma chamber 104. Plasma source 102 may be an RF plasma source (inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment, the plasma source 102 is an ICP source with an RF generator 108, and RF matching network 110. The transfer of the RF power from the RF generator to the gas atoms and/or molecules takes places through an antenna and a dielectric window (not shown). A gas manifold 106 is connected to the plasma source 102 through appropriate gas lines and gas inlets. The plasma source 102 or other components of the processing apparatus 100 also may be connected to a vacuum system (not shown), such as a turbo molecular pump backed by a rotary or membrane pump. The plasma source 102 is surrounded by an enclosure 126, and an insulator 140 separates the enclosure 126 from a process chamber 142 that includes a substrate holder 120. Plasma source 102 and substrate holder 120 may be at elevated electrical potential or may be electrically grounded whereas the process chamber 142 may be electrically grounded.

Figure 1B:
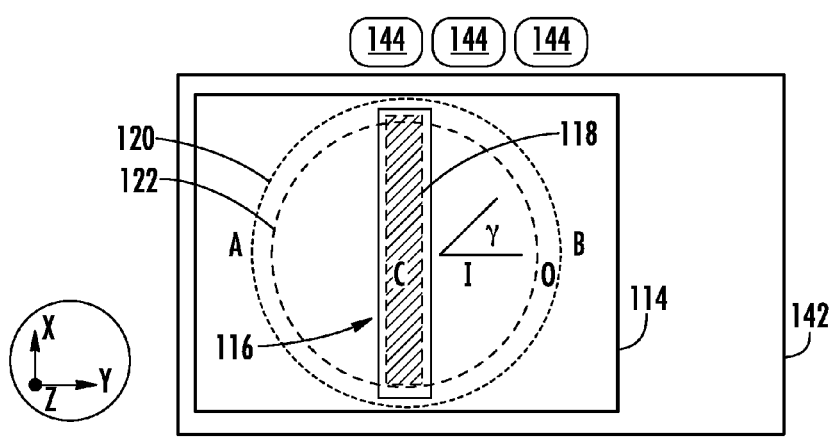
FIG. 1B provides a top plan view depiction of one embodiment of an extraction plate and process chamber of the processing apparatus of FIG. 1A.

An extraction plate 114 may be arranged along a side of plasma chamber 104 as shown in FIG. 1A. In the view of FIG. 1A the extraction plate 114 is arranged at the bottom of the plasma chamber 104. The extraction plate 114 in particular is disposed between the plasma chamber 104 and process chamber 142. The extraction plate 114 may define a portion of a chamber wall of the plasma chamber or process chamber or both, in some instances. The extraction plate 114 includes an aperture 116 through which ions may be extracted as an ion beam 118 and directed toward the substrate holder 120. FIG. 1B provides a top plan view depiction of one embodiment of the extraction plate 114 and process chamber 142 with the plasma chamber 104 and other components of processing apparatus 100 omitted for clarity.

The processing apparatus 100 further includes a plurality of voltage supplies used to drive the extraction optics and to control ion beam energy provided to the substrate 122. These are illustrated collectively as an extraction voltage system 130. In various embodiments, the extraction voltage system 130 may include a chamber power supply 132, extraction plate power supply 136 and a substrate power supply 138. In order to generate positive ion beams as represented by ion beam 118 having a desired energy at the substrate 122, the substrate power supply 138 may bias the substrate holder 120 negatively with respect to ground, while the plasma chamber 104 is grounded. Alternatively, the plasma chamber 104 may be biased positively with respect to ground and the substrate holder 120 may be grounded or biased negatively with respect to ground. In some embodiments, the extraction plate 114 may be biased independently of the plasma chamber 104 using the extraction plate power supply 136 or may be floating. The embodiments are not limited in this context.

Processing apparatus 100 also includes a control system 150 to control operation of various components of the processing apparatus 100. The control system 150 may include a combination of hardware and software components that direct operation of components of the processing apparatus 100 including the RF generator 105, mass flow controllers (not shown), movement and position of substrate holder 120, and extraction voltage system 130, among other features. The control system 150 may include, for example, a computer-readable storage medium comprising instructions that, when executed, cause the processing apparatus 100 to dynamically adjust operation of the processing apparatus components in response to real time signals generated by material etched from a layer stack on the substrate 122, as well signals from ion beam profile measurements.

In various embodiments the substrate holder 120 may be coupled to a drive 148 that is configured to move the substrate holder 120 along a direction parallel to the Y axis of the Cartesian coordinate system shown. In further embodiments, the substrate holder 120 may be movable along a direction parallel to the X-axis, Z-axis, or both. This provides the processing apparatus 100 with multiple degrees of freedom, i.e., allows relative position of the substrate vs. extraction aperture to be modified and allows the substrate 122 to be scanned with respect to the aperture 116 so that ion beam 118 may be provided over the entire substrate 122 surface in some instances. As suggested in FIG. 1B, the substrate holder 120 and substrate 122 may also be rotatable within the X-Y plane through a rotation angle γ.

FIG. 1B provides details of a plan view depiction of one embodiment of the extraction plate 114 in which the aperture 116 is elongated in the direction parallel to the X-axis, so as to extract ion beam 118 as ribbon beams. In various embodiments, ion beam width of the ion beam 118 along the X-axis may be greater than the dimension of the substrate 122 along the X-axis as illustrated. For example, for a substrate dimension along the X-axis of 30 cm, the width of an ion beam may be a few cm wider such as 33 cm, so that the substrate 122 is processed on its entire width in one pass. As shown in FIG. 1B, an elongated portion of the substrate 122 that lies adjacent the aperture 116 may be exposed to the ion beam 118 at any given instance. Accordingly, in order to expose the entire substrate 122 to etching by the ion beam 118, in one example of operation of the processing apparatus 100, the substrate holder 120 may be scanned back and forth along a direction parallel to the Y-axis between points A and B. In some examples, during etching of a given layer of a given substrate 122, the substrate may be rotated within the X-Y plane multiple times to expose different portions of features to be etched by the ion beam 118. This rotation may be performed, for example, multiple times during etching of a given layer of a layer stack formed on the substrate in order to form a patterned feature such as an MRAM device containing multiple layers.

As further shown in FIG. 1A, when the plasma 112 is generated in the plasma chamber 104 a plasma sheath boundary 115 of the plasma 112 may assume a curvature that forms a meniscus 117 proximate the aperture 116. The exact shape of the meniscus 117 may be varied by altering control settings of the processing apparatus 100. In this manner the trajectories of ions that are extracted through the aperture 116 may be varied by adjusting control settings of the processing apparatus 100, as discussed below. In particular, when a voltage is applied between the substrate holder 120 and plasma chamber 104, which is termed herein an "extraction voltage," the ion beam 118 is extracted from the plasma 112 and directed to the substrate 122. The high voltage may be provided by chamber power supply 132 or substrate power supply 138 and generate a negative polarity on the substrate holder 120 so that positive ions are extracted from the plasma 112.

In various embodiments the ion beam 118 may comprise ions such as inert gas ions, reactive ions, or both inert gas ions and reactive ions, which sputter etch material from the substrate 122 by known physical etching processes. In the embodiments disclosed herein below, the physical etching of a layer stack formed on substrate 122 may be dynamically adjusted by adjusting control settings such as the RF power delivered to the plasma chamber 104, or voltage applied by components of processing apparatus 100, as well as positioning of the substrate 122 with respect to the extraction plate 114. This dynamic adjusting of control settings facilitates the ability to tailor the etching performed by the ion beam 118 for different layers of a layer stack. Because the ion beam 118 may be used to sputter etch a device structure composed of different layers in a layer stack in which the sputter etch characteristics may vary between the different layers, it may be useful to adjust an ion beam profile of the ion beam 118 according to the layer being etched. This may result in a better device structure after all layers in the device structure are etched as noted. The term "ion beam profile" as used herein refers to characteristics or parameters of an ion beam including ion energy, ion beam current or ion beam current density, and ion angular distribution (IAD). The term "ion angular distribution" as used herein refers to the mean angle of incidence of ions in an ion beam with respect to a reference direction such a perpendicular to a substrate, as well as to the width or range of angles of incidence around the mean angle, which range is termed "ion angular spread" for short. In various embodiments, the ion beam profile is adjusted by adjusting control settings such as extraction voltage, gas pressure in plasma chamber 104, and RF power supplied to plasma chamber 104, as well as other settings discussed below. The ion beam profile may also be adjusted by adjusting the separation of the extraction plate 114 and substrate holder 120 along a direction parallel to the Z-axis of the Cartesian coordinate system shown, which separation is referred to herein as "z-gap."

In various embodiments, when the ion beam 118 is directed to the substrate 122, a signal 146 may be generated from a layer or layers of a layer stack formed on the substrate 122. FIG. 2A depicts a side view of an exemplary MRAM layer stack, shown as layer stack 200, which may be etched by processing apparatus 100 and may emit signals characteristic of multiple different elements during etching as discussed in more detail below. As further shown in FIG. 1A, a monitoring apparatus 144 is provided in processing apparatus 100, which may detect the signal 146. The signal 146 may provide real time information concerning a layer or layers (not shown in FIG. 1A) that are being etched by the ion beam 118. For example, in embodiments in which the monitoring apparatus is an OES device, the signal 146 may represent emission spectra from at least one element that is sputter etched from the substrate 122 and emits radiation characteristic of that element. As is known an OES device may collect emission spectra from one element or multiple different elements simultaneously, which may indicate the element or elements of a layer being etched and thereby identify the layer. When the ion beam etches to the bottom of a first layer the intensity of the OES signal of a first element from the first layer may decrease or vanish as species from that element are no longer sputter etched into the gas phase. At the same time the intensity of the OES signal from a second element of a second layer that was initially disposed underneath the first layer may increase as the ion beam 118 begins to etch the second element.

Depending upon the sputter etch characteristics of the first layer and the sputter etch characteristics of the second layer, it may be useful to change the ion beam profile of ion beam 118 when etching of the first layer is complete and etching of the second layer is to commence. Thus, the increase in an OES signal characteristic of an element from the second layer or the decrease in the OES signal of an element from the first layer, or a combination of the two, may be used to identify an instance or interval in which the ion beam profile of ion beam 118 is to be dynamically adjusted during etching of a substrate. The adjusting of the ion beam profile for ion beam 118 may be performed multiple times in some instances in which a layer stack comprising multiple different layers is etched.

In various embodiments the processing apparatus 100 may include metrology (not shown) to measure an ion beam profile of the ion beam 118. For example, the metrology may include known current probes and energy probes to measure the IAD of an ion beam as well as energy and current of an ion beam. This metrology may be employed in conjunction with the control system in some cases in a feedback loop so that adjustment to control settings is performed until a target ion beam profile to be used for etching a given layer or layers is achieved as measured by the metrology.

Returning to FIG. 2A the layer stack 200 is composed of multiple layers formed on a substrate base 224. In one example substrate base 224 is silicon, layer 222 is silicon oxide, layer 220 is Ta, layer 218 is Ru, layer 216 is Ta, layer 214 is PtMn, layer 212 is CoFe alloy, layer 210 is Ru, layer 208 is CoFeB alloy, layer 206 is MgO, layer 204 is CoFeB alloy, and layer 202 is Ta. In one particular instance, the layer 202 may have a thickness of 50 nm, layer 218 a thickness of 50 nm, and layer 214 a thickness of 20 nm. The other layers of layer stack 200 may have a thickness in the range of 1 nm to 3 nm. However, the embodiments are not limited in this context. Many or most of the layers of the layer stack 200 may be resistant to etching by reactive ion etching, as noted above, and may be more effectively etched by physical sputtering. However, because the etch characteristics may vary between the different layers, when the layer stack 200 is sputter etched to form MRAM device structures, it may be useful to adjust at least one of incidence angle, ion angular spread, or ion energy of the ion beam 118 so that sputter etching of different layers can be tailored for the different layers. It may also be useful to adjust composition of etching species such as to add Xe to an Ar plasma when a new layer is detected that is harder to etch than a previous layer.

FIG. 2B depicts one instance in which the layer stack 200 has been partially etched by ion beam 232 to form MRAM features 230. The sputter etching to define the MRAM features 230 is facilitated by forming a mask that contains a plurality of mask features 234 over portions of the substrate 240. Those portions of the substrate 240 that are not covered by the mask features 234 are etched by the ion beam 232. Notably, the mask features 234 may also be physically etched by the ion beam 232, but may be formed with sufficient thickness to allow the layer stack 200 to be etched to sufficient depth to form the desired device structure. In the instance of FIG. 2B the layer stack 200 is shown schematically and may not include all the layers as described with respect to FIG. 2A. As etching proceeds, a signal 236 is generated, which may be an OES signal that is detected by monitoring apparatus 144. This OES signal may vary as different layers of the layer stack 200 are etched, as illustrated in FIG. 3A. In particular, FIG. 3A is a graph that depicts signal intensity of OES spectra that comprise multiple different emission spectra characteristic of different elements of the layer stack 200, which are monitored as a function of time. The ordinate of the graph of FIG. 3A is intensity of emission spectra while the abscissa represents the depth of material being etched, with the outer surface of the layer stack 200 toward the left. In the example of FIG. 3A OES spectra are collected after etching of the tantalum layer, as represented by layer 202. As time proceeds etching of the layer stack 200 causes a change in the emission spectra as different layers are etched. For example, the MgO signal 250 shows a pronounced and narrow peak representative of layer 206, which may have a thickness of 1 nm to 2 nm. The Ru signal 252 has a small peak characteristic of layer 210, which may have a thickness of 1 nm in one example. The Ru signal also exhibits a larger and broader peak representative of layer 218. In addition, FIG. 3 shows a Pt signal 258 representative of platinum in a PtMn material of layer 214, a Ta signal 256 from layer 216, and an Fe signal 260 which may represent iron in layer 212, layer 208, and layer 204. Finally, a silicon signal 254 is representative of silicon in layer 222 and substrate base 224.

As illustrated by FIG. 3A, the intensity of emission spectra characteristic of different elements in the layer stack 200 varies substantially with time or depth, allowing the determination of when etching of one layer terminates and etching of a subsequent layer begins. In various embodiments the emission spectra received from a process chamber during etching by the ion beam 232 may be monitored as part of a feedback system that includes the monitoring apparatus 144 and control system 150. For example, when emission from an element representative of a new layer is detected above a threshold, the monitoring apparatus 144 may output a signal 238 that is received by the control system 150, which triggers adjustments to control settings of a process system that generates the ion beam 232. As detailed with respect to the figures to follow, in some embodiments this adjustment to control settings may change to at least one of ion energy, ion current density, mean angle, or angular spread of the ion beam 232. During the etching of the layer stack 200, adjustments to control settings may be made on multiple occasions, such as the instance when emission from an element characteristic of a new layer is detected by the monitoring apparatus 144. In other examples, adjustments to control settings need not be made when a new layer is detected. For instance if sputter etch characteristics of an overlayer in the layer stack 200 are similar to those of an underlayer adjacent the overlayer, the ion beam profile of ion beam 232 may be maintained for etching of both the overlayer and underlayer.

However, during etching of a first layer when a new element is detected from a second layer that has different etch characteristics than element(s) of the first layer, control settings may be adjusted to tailor the ion beam profile to better etch the new element.

FIG. 3B depicts sputter rate as a function of ion incidence angle for various materials, illustrating the fact that sputter yield behavior may vary substantially for different layers that may be used in a layer stack. The sputter rate is specifically shown as an etched thickness (thickness loss) after a dose of 1E17 Ar ions extracted at a voltage of 1.5 kV is directed at to a layer composed of a given material. The ion incidence angle is varied from 0 degrees, which is perpendicular to the plane of the given layer, to 85 degrees. Thus, in the context of etching a layer stack as shown in FIG. 2B, an ion incidence angle of 60 degrees represents an ion incidence angle that forms an angle of 60 degrees with respect to perpendicular (along the Z-axis) to the top surface 235 of a structure being etched; while the same ion incidence angle of 60 degrees forms an angle of incidence of 30 degrees with respect to a perpendicular (along the Y-axis) to a vertical sidewall 237 of the same structure. FIG. 3B in particular provides sputter etch rate data for five different materials at ion incidence angles of 0 degrees, 15 degrees, 30 degrees, 45 degrees, 60 degrees, 70 degrees, 80 degrees, and 85 degrees. Within each group of data, as illustrated by data group 262 for 15 degrees ion incidence angle, the etch rate data is provided as a set of histograms in order from left to right for W, Ru, MgO, TiN, and Ta. Thus bar 264 represents W, bar 266 Ru, bar 268 MgO, bar 270 TiN, and bar 272 Ta. To highlight differences in sputter etch behavior, it is to be noted that the sputter etch rate of MgO is very low for ion incidence angles below 45 degrees and reaches a peak in etch rate at 70 degrees. In contrast, the sputter etch rate for Ru is relatively high and relatively constant over a range of ion incidence angles between 15 degrees and 80 degrees, reaching a peak at 60 degrees. Moreover, the sputter etch rate for TiN remains relatively low below ion incidence angle of 60 degrees and peaks at an ion incidence angle of 80 degrees. Using this data, a first layer comprising ruthenium may be etched under control settings that generate an ion incidence angle of 30 degrees. When a subsequent layer that is composed of MgO is detected, the control settings may be adjusted to generate an ion incidence angle of 60 degrees to etch the MgO layer more efficiently.

In other embodiments, ion energy, beam current, as well as ion species may be adjusted to account for differences in sputter etch behavior of different layers. In addition to adjusting control settings to account for differences in sputter etch behavior of different layers, control settings may also be adjusted to account for differences in redeposition rate among different materials.

Figures 4A, 4B:
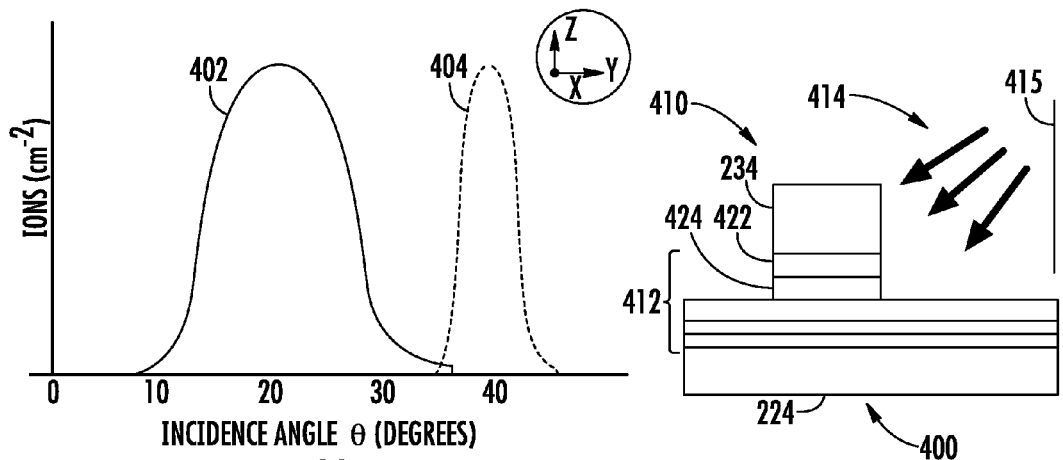
FIG. 4A depicts an example of two different ion angular distributions that may be applied for etching of two different layers of a layer stack.
FIG. 4B shows an embodiment in which an ion beam is directed to a substrate to produce an etched structure.

FIG. 4A depicts an example two different ion angular distributions that may be applied for etching of two different layers of a layer stack. The ion angular distributions are shown as a relative density of ions as a function of ion incidence angle (θ) which may be defined with respect to a perpendicular 415 to the X-Y plane of a substrate as shown in FIG. 4B. The IAD 402 has a relatively larger angular spread and lower mean angle while the IAD 404 has a relatively narrower angular spread but larger mean angle.

Referring also to FIG. 4B there is shown an example in which an ion beam 414 is directed to a substrate 400 to produce an etched structure 410. The etched structure 410 may form an MRAM cell when etching is complete. The etched structure 410 may be produced by etching a layer stack 412 that is partially masked by at least one mask feature, such as mask feature 234. In one example, the ion beam profile of ion beam 414 may be dynamically adjusted during etching of the layer stack 412 on at least one occasion to tailor the etching of the etched structure 410 according to the sputter etch characteristics of the layer being etched. For example, control settings may be set to a first set of control settings to generate the IAD 402 in ion beam 414 to etch the layer 422, whose element(s) may be more suitable for etching at a mean angle of 20 degrees. Subsequently, when etching of the layer 422 is nearing completion or when etching of the layer 424 has commenced, an increase in an OES signal from an element in layer 424 may be detected or a decrease in an OES signal from an element in layer 422 may be detected. As detailed in figures to follow, based upon the nature of the material (elements) in the layer 424, a determination may be made that control settings are to be adjusted to a second set of control settings, which results in generating the IAD 404 in ion beam 414. Etching of layer 424 using the IAD 404 may then proceed until a subsequent layer is detected, at which point further adjustments to control settings may or may not be made depending on the nature of element(s) in the subsequent layers. This may result in the generation of IAD 402, for example, or a different IAD.

In addition to adjusting of IAD between different layers of a layer stack, in various embodiments other components of an ion beam profile may be adjusted. In some instances, as detailed below, ion energy of an ion beam such as the ion beam 414 may be adjusted according to a layer being etched. This may be accomplished, for example, by adjusting the extraction voltage, which may directly determine the ion energy. For example, the plasma potential of a plasma in plasma chamber may be a few volts up to several tens of volts higher than the potential of the plasma chamber. Thus, when an extraction voltage of 1000 V is applied between the plasma chamber and substrate holder, singly charged positive ions exiting the plasma may be accelerated to the substrate with an energy of 1020 V, for example. The adjusting of ion energy for an ion beam 414 may be useful when successive layers having different etchability are to be etched. For example, a metal layer that is harder to etch may be subjected to an ion beam having a higher ion energy and larger mean angle of incidence as compared to a metal layer that is easier to etch.

In further embodiments, the beam current of an ion beam may be adjusted between etching of successive layers. In some implementations beam current may be adjusted by providing an ion beam as a pulsed ion beam having "ON" and "OFF" portions within a given pulse period. The pulsing may be accomplished by pulsing of extraction voltage between ON and OFF states or by pulsing of a plasma in a plasma chamber between ON and OFF states. By varying the ion beam duty cycle of such a pulsed ion beam, that is, the ratio of the duration of ON state to the total duration of an ON and OFF state ($D_{ON}/(D_{ON}+D_{OFF})$), the average beam current delivered over time may be adjusted. This may allow the etch rate to be reduced or increased as desired for a given layer to be etched. In some implementations the duty cycle may be varied by varying the duration of an ON portion within a pulse period in which the frequency of the pulse period is held constant, while in other implementations the duty cycle may be varied by varying the frequency (duration) of a pulse period while holding the duration of the ON portion constant. The embodiments are not limited in this context.

In order to more accurately determine when to adjust an ion beam profile to tailor etching to the etch characteristics of a given layer, in some embodiments multiple monitoring apparatus, such as two-, three-, four- or a greater number of monitoring apparatus, may be used to monitor species being etched from a substrate. Because layer thickness of a given layer to be etched may not be perfectly uniform across the substrate, and because ion beam current density across a substrate may vary, for example, along a direction parallel to the Y-axis, etching of a given layer may vary between different points in a substrate. This may result in the complete removal of a first layer of a layer stack in one region of the substrate while a portion of the first layer remains in another portion of the substrate. Returning now to FIG. 1B there is shown an example of the use of three monitoring apparatus, shown as the monitoring apparatus 144 arranged in a line parallel to the Y-axis. In this manner OES signals, for example, may be monitored from species that are detected from different positions adjacent a substrate. These different positions may provide optical emission from species sputtered from different portions of the substrate 122, such as a center region C, intermediate region I, and outer region O. If etching of a given layer proceeds in a non-uniform manner along the direction parallel to the Y-axis, the OES signal detected by monitoring apparatus 144 adjacent center region C may be different from that of an OES signal detected by a monitoring apparatus 144 adjacent outer region O. In one example, the control system 150 may receive OES signals from all three monitoring apparatus and make a determination as to when etching of a given layer is deemed to be complete and accordingly when a given set of control settings is to be changed based upon an average of the three OES signals. In another example, in response to non-uniformities detected a control system may adjust scan speed, duty cycle of a pulsed plasma, or a substrate rotation scheme to enable better etch uniformity.

In particular embodiments, during etching within a layer of a layer stack the duty cycle may be adjusted as a function of position of a substrate during scanning of the substrate with respect to an extraction plate. For example, etching of layers within a layer stack may be accomplished by scanning a substrate along a given direction under an elongated aperture of an extraction plate that is elongated in a direction perpendicular to the given direction as discussed above with respect to FIG. 1B. If, at a given time, a non-uniformity in layer thickness or etch rate from center-to-edge is detected as a function of position on a substrate along the given direction, this may be compensated for by adjusting the effective beam current by varying the duty cycle as the substrate is scanned along the given direction.

In one implementation, the center-to-edge non-uniformity may be detected by an array that includes a plurality of OES detectors placed at different positions with respect to a substrate, such as different positions along a first direction parallel to the Y-axis as illustrated in FIG. 1B. Different OES signals may be detected, for example, simultaneously from different OES detectors, which may indicate the composition of material being sputtered from different portions of a substrate at any given instance. In one scenario, by detecting OES signals in different OES detectors placed at different positions with respect to a substrate, a decrease in signal intensity that indicates completion of etching of a given layer may be detected at different times in the different OES detectors. For example, a signal intensity decrease for an Ru layer may be detected firstly at an OES detector placed to intercept optical emission from species sputtered adjacent to outer portion of a wafer. In this case, the duty cycle of a pulsed plasma may be selectively decreased when the edge of the wafer is scanned under an aperture in order to reduce etch rate of the Ru layer along outer portions of the wafer. Alternatively, the duty cycle of a pulsed plasma may be selectively increased when inner portions of the wafer are scanned under the aperture to increase the etch rate of the Ru layer with respect to the outer portion.

Moreover, in further embodiments other adjustments may be made in response to different OES signals that are received from different OES detectors. For example, a first OES signal may be received at a given time from a first OES detector arranged at a first position along a first direction, which may be the scan direction of a substrate. A second OES signal may be received at the same time from a second OES detector arranged at a second position along the first direction, where the second OES signal is different from the first OES signal. The difference in OES signals may indicate that etching is taking place in different layers at the different positions, for example, or that etching is nearing completion in a given layer at the first position but is not near completion at the second position. Accordingly, the aforementioned adjustment to duty cycle of a pulsed ion beam may be performed as the substrate is scanned between the first position and second position. However, other control settings may be dynamically adjusted to reduce (or increase) the etch rate within a layer during scanning of the substrate from the first position to second position, such as adjusting plasma power or scan rate of the wafer.

In various embodiments the dynamic control of ion beam profile of an ion beam used to etch a layer stack may be at least partially automated by software, hardware, or a combination of hardware and software that may reside in the control system 150. Included herein is a set of flow charts representative of exemplary methodologies for performing novel aspects of the disclosed dynamic ion beam etching. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. Moreover, not all acts illustrated in a methodology may be required for a novel implementation.

Figure 5:
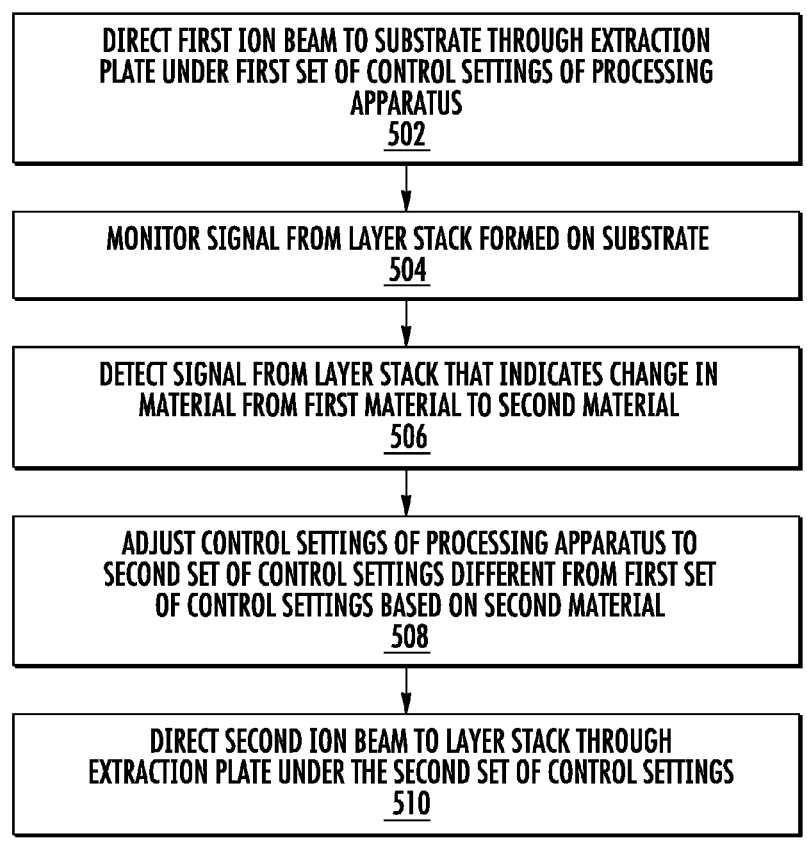
FIG. 5 depicts an exemplary first process flow.

FIG. 5 depicts an exemplary first process flow 500 for implementing dynamic ion beam etching. This process flow and others disclosed in the figures to follow may be implemented in a processing apparatus such as the processing apparatus 100 disclosed above. At block 502, a first ion beam is directed to a substrate through an extraction plate using a first set of control settings of a processing apparatus. For example, the first control settings may be arranged to generate an ion beam having a first ion angular distribution and ion energy that is suitable for etching a first element that makes up a first layer of a layer stack formed on the substrate.

At block 504 a signal is monitored from the layer stack such as an OES signal emitted from species sputtered by the first ion beam from the layer stack. In particular embodiments, the signal may comprise radiation intensity over a range of wavelengths in which different wavelength ranges characteristic of optical emission for different elements are monitored. Thus, the signal may constitute intensity of radiation detected over at least one wavelength range.

At block 506, a signal is detected from the substrate such as from the layer stack that indicates a change in material from a first material to a second material. This signal from the substrate may constitute a decrease in intensity of an emission line of a first species that is etched from the substrate. The emission line for the first species may occur at a first wavelength range that is characteristic of an element in a first layer being etched. When the emission line intensity decreases this may be deemed to indicate that a change in material being etched is taking place, which may indicate that a new, second layer having a different element(s) is being etched. Alternatively, the signal from the substrate may be an increase in intensity of an emission line at a second wavelength that is characteristic of an element in a second layer to be etched, which may be also deemed to indicate that the second layer is being etched. In addition, the signal from the substrate may be a change in reflectivity of the surface of the substrate that may occur when etching of a first layer having a first reflectivity terminates.

At block 508, control settings of the processing apparatus are adjusted to a second set of control settings that are different from the first set of control settings. The second set of control settings are based upon the second material to be etched. For example, the second set of control settings may be used to generate an ion beam profile tailored for etching the second material, which may differ from an ion beam profile tailored for etching the first material in the first layer. In some embodiments, the second set of control settings may be automatically generated by retrieving a recipe that specifies a set of control settings that is associated with the element in the second layer, or is associated with a material containing the element in the second layer, such as an alloy or compound.

At block 510 a second ion beam is directed to the layer stack through the extraction plate using the second set of control settings. The second ion beam may comprise the same ion species as the first ion beam, but is referred to as a second ion beam because its energy and ion angular distribution may differ from that of the first ion beam.

In various embodiments, the process flow as generally depicted between between blocks 504 and 510 may be repeated for sequentially for etching additional layers of a layer stack. Thus, when the second layer of the layer stack is etched a signal may be monitored to determine when etching of the second layer is complete and etching of a third layer containing a third material is to commence. Based upon element(s) of the third material the control settings may be adjusted to a third set of control settings that are configured to generate a third ion beam having an ion beam profile tailored to etch a third element or elements in the third layer.

Figure 6:
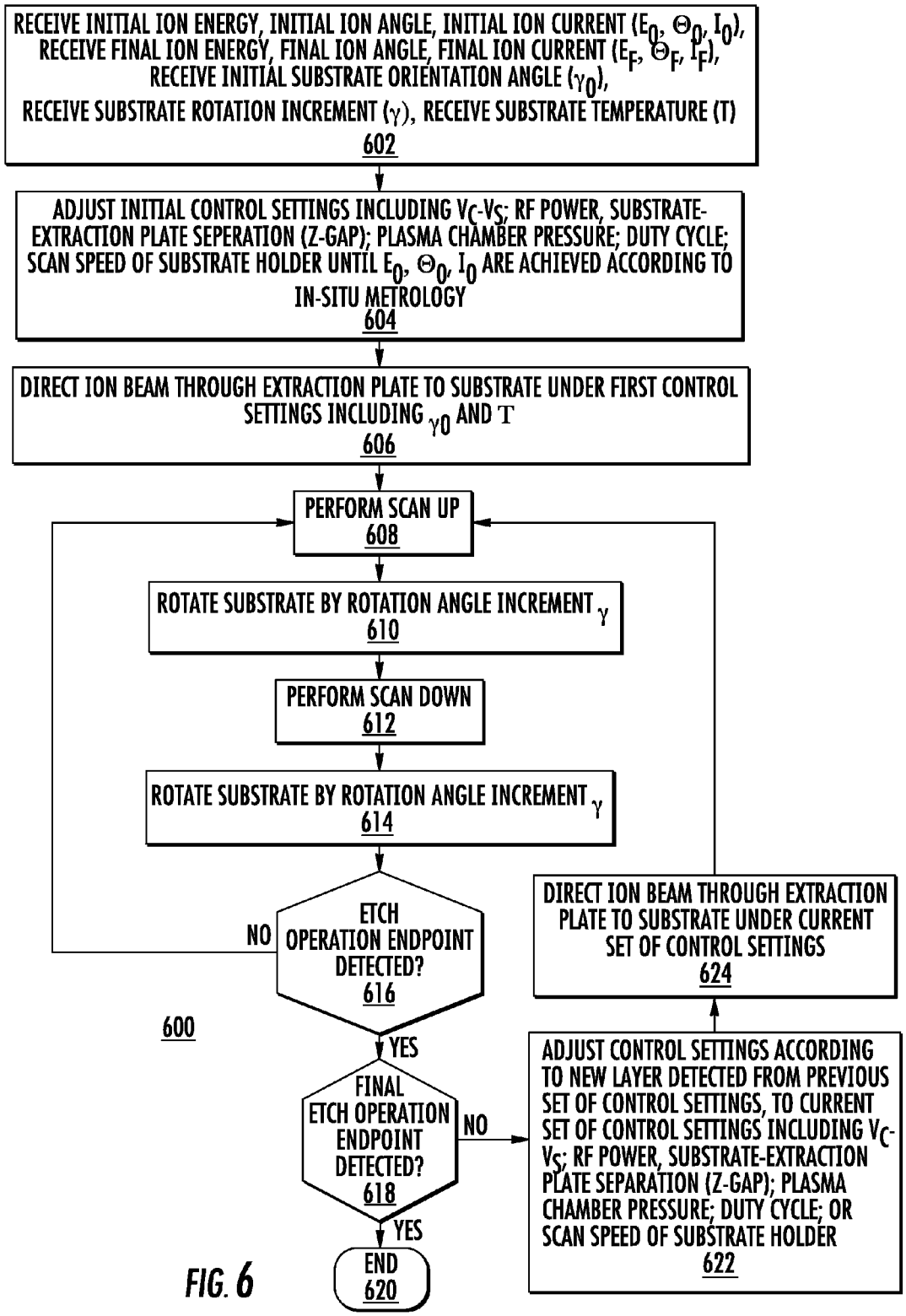
FIG. 6 depicts an exemplary second process flow.

FIG. 6 depicts an exemplary second process flow, process flow 600, for implementing dynamic ion beam etching. At block 602, an initial ion beam profile is received including an initial ion energy, initial ion angle of incidence, initial ion current ($E_0$, $\theta_0$, $I_0$) A final ion beam profile is received including a final ion energy, final ion angle, final ion current ($E_f$, $\theta_f$, $I_f$). In addition, an initial substrate orientation angle ($\gamma_0$), and substrate rotation increment ($\gamma$), and substrate temperature (T) is received. In response to the receipt of the initial ion beam profile a preliminary ion beam may be generated using an initial set of control settings. In some variants metrology may be performed to measure the preliminary ion beam.

At block 604 an initial set of control settings are adjusted until the initial ion beam profile including $E_0$, $\theta_0$, $I_0$ is achieved. The initial control settings that are adjusted may include an extraction voltage as determined by difference in plasma chamber voltage and substrate voltage ($V_C$-$V_S$) for the processing apparatus. Other initial control settings that may be adjusted include RF Power supplied to a plasma chamber of the processing apparatus, Z-gap, gas pressure in the plasma chamber, duty cycle of the ion beam, as well as scan speed of the substrate holder. The determination that the initial ion beam profile is achieved may be made based on measurements of a preliminary ion beam received from in-situ metrology that is performed by apparatus located in a process chamber. The adjusted control settings may constitute a first set of control settings to be applied for etching a substrate.

At block 606 an ion beam is directed through an extraction plate to a substrate using the first set of control settings that may include, in addition to the aforementioned control settings, a substrate temperature and initial substrate orientation angle $\gamma_0$. At block 608 a "scan up" is performed in which the substrate is scanned in a first direction with respect to the extraction plate. At block 610 the substrate is rotated by the rotation increment $\gamma$, and the substrate is scanned down in a second direction opposite the first direction at block 612. At block 614 the substrate is again rotated by the rotation angle increment $\gamma_0$.

At decision block 616 a determination is made as to whether an operation endpoint has been detected. The operation endpoint may be deemed to be the instance at which etching of a layer or layers of a layer stack has been completed. If the operation is not complete, for example, if no OES signal is detected indicating that a new layer is being etched, the process returns to block 608. If so, the process moves to decision block 618.

At decision block 618 a determination is made as to whether a final etch operation endpoint is detected. For example, a final etch operation endpoint may be an instance in which etching of a layer stack is complete. This may be determined in one implementation when an OES signal from a substrate element such as silicon increases. If so, the process ends at block 620. If not, the flow proceeds to block 622.

At block 622, control settings of the process apparatus are adjusted according to a new layer detected from a previous set of control settings, which may be the first set of control settings discussed above. For example, the control settings may be adjusted based upon an increase in a signal of an element or elements detected by an OES device, which is deemed to indicate the beginning of etching of a new layer. The control settings are adjusted to a current set of control settings including the adjustment of any of the extraction voltage ($V_C$-$V_S$), RF-power, Z-gap, plasma chamber gas pressure, duty cycle of a pulsed ion beam, or scan speed of the substrate holder. In some embodiments, the current set of control settings established at block 622 may be automatically generated by retrieving a recipe that specifies a set of control settings that is associated with an element or elements in the new layer to be etched.

At block 624 an ion beam is directed through an extraction plate to the substrate using the current set of control settings. The flow then returns to block 608.

Figure 7:
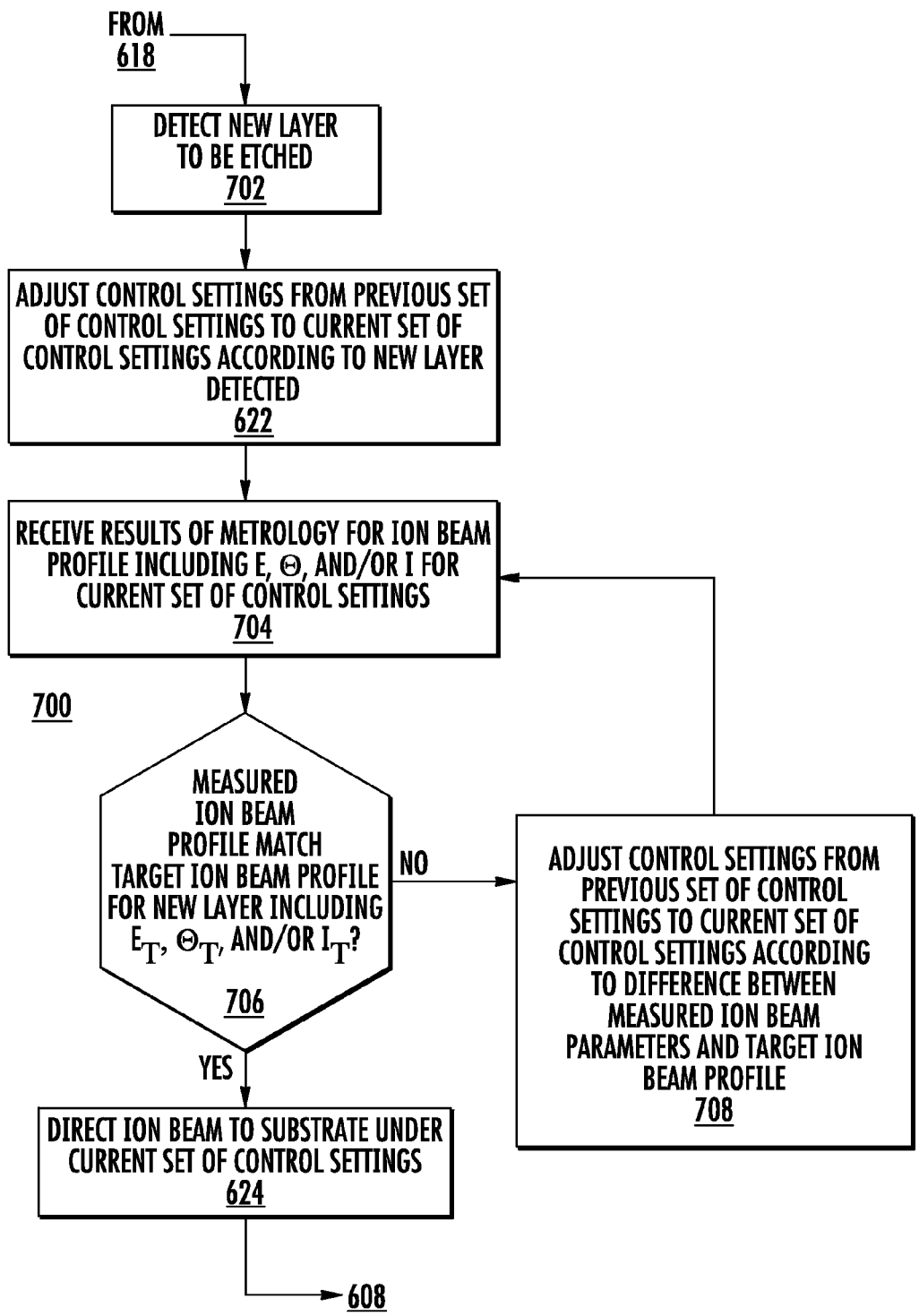
FIG. 7 depicts an exemplary third process flow.

In various embodiments, the determination of how to tailor the control settings of a processing apparatus according to a layer to be etched may be performed in different ways. FIG. 7 depicts an exemplary third process flow, process flow 700, for implementing dynamic ion beam etching. In particular, FIG. 7 provides one implementation of adjusting control settings according to a layer to be etched. FIG. 7 may be implemented within the process flow 600 discussed above. For example, the process flow 700 may be implemented between decision block 618 and block 608. At block 702, a new layer to be etched is detected. The new layer may be detected by OES for example as described above. The flow then proceeds to block 622, where control settings are adjusted to a current set of control settings according to the new layer as detailed above. In some embodiments, the current set of control settings established at block 622 may be automatically generated by retrieving a recipe that specifies a set of control settings that is associated with an element or elements in the new layer to be etched. This may establish a recipe for etching the new layer that is based upon previous measurements or calculations in order to approximate a target ion beam profile to etch the new layer.

Subsequently, after the adjusting of the control settings to a current set of control settings, these control settings may be iteratively adjusted before etching the new layer in order to establish that the adjusted ion beam does in fact have the target ion beam profile to etch the new layer. Metrology of the ion beam produced after the adjusting of the control settings to a current set of control settings may be performed to assess the ion beam profile. At block 704, results are received of metrology that measures an ion beam profile of an ion beam produced using the current set of control settings including at least one of ion energy, ion mean angle or ion beam current.

At decision block 706 a determination is made as to whether an ion beam profile of the ion beam produced using the current set of control settings matches a target ion beam profile. If so, the flow moves to block 624 where the ion beam is directed to the substrate using the current set of control settings. If not, the flow proceeds to block 708.

At block 708 the control settings are adjusted to a new (current) set of control settings from a previous set of control settings. The adjusting of control settings may be based upon the difference between the measured ion beam profile at block 704 and the target ion beam profile. Examples of process flows for adjusting control settings to better match components of an ion beam profile are provided in FIGS. 8 and 10-11 to follow. Subsequently further metrology may be performed on an ion beam produced using the current set of control settings. The flow then returns to block 704.

In some implementations, the layer sequence of a layer stack to be etched may be known a priori. In such cases multiple different recipes that each specifies a set of control settings to be used for a given layer to be etched may be retrieved during etching, such that a given recipe is triggered when a signal indicative of the given layer is detected as described above. In other implementations, the layer sequence of a layer stack may not be known to the processing apparatus a priori. However, even in the latter case, a recipe may be prestored for a given that specifies a predetermined set of control conditions to be used to generate an ion beam to etch the given layer, and the recipe may be loaded when the given layer is detected. In either circumstance, during etching of a layer stack containing multiple layers, the adjusting of control settings for etching a first layer to etching an immediately succeeding layer may depend on any differences in the recipe for etching the first layer and the recipe for etching the immediately succeeding layer. In some cases multiple control settings may be changed when a new layer is detected, while in other cases a single control setting may be changed, while in still other cases, no control settings may be changed.

In addition, whether or not the exact sequence of layers in a layer stack to be etched is known a priori, the adjusting of control of settings between etching of successive layers may proceed in stages. Thus, when a signal indicative of a new layer is detected, the first control settings may be initially adjusted to a predetermined set of control settings that are associated with the second material in the second layer. The predetermined set of control settings may be designed to generate an ion beam having a target ion beam profile including parameters such as ion energy, ion incidence angle, ion angular spread, and so forth, that is tailored for sputter etching the second material. After performing metrology to measure at least one parameter of an ion beam directed through the extraction plate using the predetermined set of control settings, it may be determined that the measured ion beam profile does not match the target ion beam profile. Thus, it may be determined that the predetermined set of control settings are to be adjusted to generate an ion beam that more closely approximates the target ion beam profile. A subsequent operation may therefore involve adjusting of the predetermined set of control settings to a further set of control conditions, measuring the new ion beam produced under the further set of control conditions, and repeated this sequence until the target ion beam profile is met. Thus, the "second" set of control settings used to etch a second layer, may represent the result of multiple adjustments of control settings from the original first set of control conditions.

In some embodiments, after such an iterative adjustment of control settings is performed to generate an ion beam appropriate for etching the second layer, the second set of control conditions may be stored to supplant the previous predetermined set of control conditions as a default recipe for etching the second layer and any other layers having the same composition as the second layer. Moreover, in other embodiments, if repeated metrology of ion beams generated by a given set of control settings results in reproducibly generating a target ion beam profile, the metrology operation(s) previously performed when switching between etching a first layer under a first set of control settings and etching a second layer under a second set of control settings may be reduced or eliminated. Thus, in an operation in which a batch of wafers having the same MRAM layer stack are to be etched, metrology may be performed on several initial wafers between etching of a first layer and second layer when the control settings are changed. This may result in a stable second set of control settings that consistently generate a target ion beam profile designed to etch the second layer. Accordingly, subsequent wafers may be etched by automatically switching between a first set of control settings and second set of control settings when the second layer is detected, without performing a metrology operation.

Figure 8:
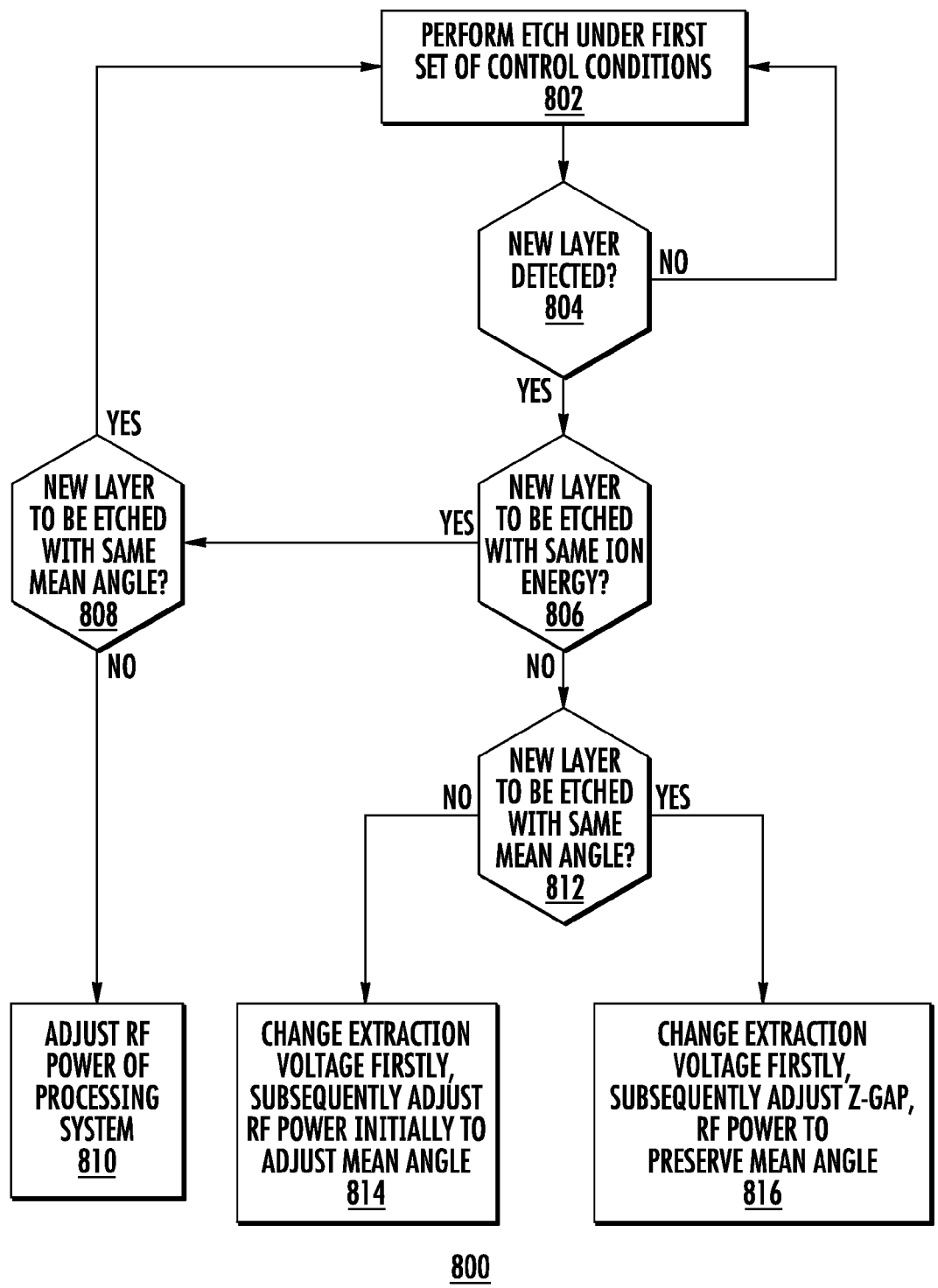
FIG. 8 depicts an exemplary fourth process flow.

FIG. 8 depicts an exemplary fourth process flow 800 for implementing dynamic ion beam etching. At block 802 etching of a layer stack using an ion beam is performed using a first set of control conditions. At decision block 804, if no new layer is detected, the flow returns to block 802 where etching continues using the first set of control conditions. If a new layer is detected, for example, by OES, the flow proceeds to block 806.

At block 806 a determination is made as to whether the new layer is to be etched with the same ion energy as that of the first set of control conditions. If so, the flow proceeds to decision block 808. At decision block 808 a determination is made as to whether the new layer is to be etched with the same mean angle. If so, the flow returns to block 802 where the etching (of the new layer) proceeds using the first set of control conditions. If not, the flow proceeds to block 810 where the RF power is adjusted to the processing apparatus. As is known, adjusting the RF power in a plasma chamber adjacent an extraction plate may change the shape of a meniscus formed at the aperture of the extraction plate, and therefore may alter the mean angle of ions exiting the plasma and directed to the substrate.

At block 806, if the ion energy is to be changed for etching the new layer, the flow proceeds to decision block 812. At decision block 812 a determination is made as to whether the new layer is to be etched with an ion beam having the same mean angle as that produced using the first set of control conditions. If not the flow moves to block 814. At block 814, extraction voltage ($V_C$–$V_S$) of the processing apparatus is changed firstly to change ion energy of the ion beam. Subsequently RF power is initially adjusted to adjust the mean angle of ions in the ion beam.

If the same mean angle is to be employed at decision block 812, the flow proceeds to block 816. At block 816, extraction voltage of the processing apparatus is changed firstly. Subsequently, the Z-gap is adjusted and RF power supplied to the plasma chamber of the processing apparatus is adjusted in order that mean angle is preserved for the new ion beam. This combination of adjustments may be needed because once extraction voltage is changed to generate the needed change in ion energy, the shape of the ion beam extracted through an aperture may be changed, resulting in a change in mean angle. In order to compensate for this result, plasma power may be altered as wells as Z-gap to offset the mean angle change induced by the change in extraction voltage.

Figure 9:
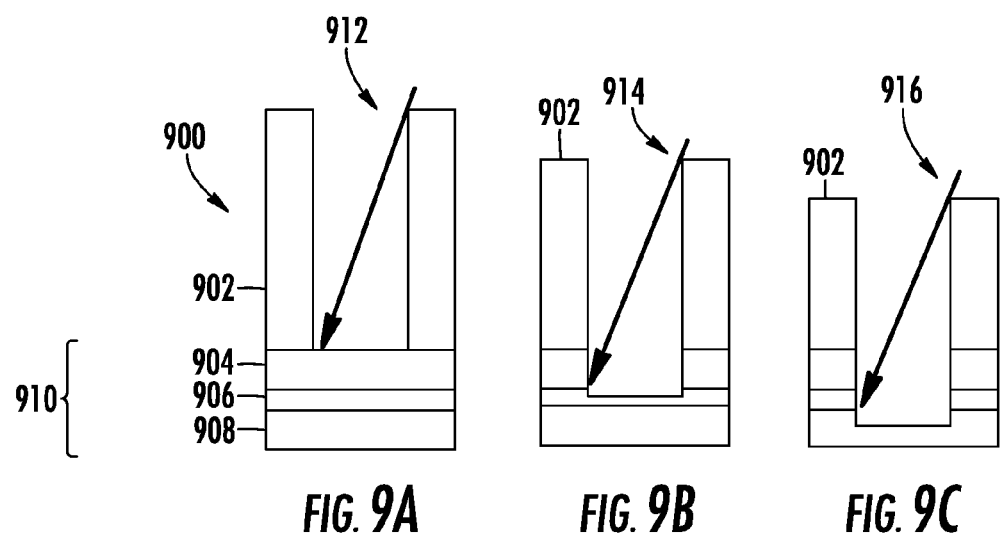
FIGS. 9A-9C present a pictorial representation of one scenario for implementing dynamic ion energy control consistent with various embodiments.

FIGS. 9A to 9C provide a pictorial representation of one scenario for implementing a process flow in which ion incidence angle is dynamically adjusted to account for different layers of a layer stack. In particular, there is shown a sequence of etch operations for etching patterned features into a substrate 900 having a layer stack 910. Mask features 902 are provided upon the layer stack 910 to define structures to be formed when ions are directed to the substrate to etch exposed portions of the layer stack 910. In FIG. 9A, ion beam 912 is directed to the substrate 900. Control settings of a processing apparatus are set to provide an ion energy, mean angle, and ion current for ion beam 912 that are appropriate for etching the top layer 904. As etching using ion beam 912 proceeds, the top layer 904 may be removed exposing middle layer 906. The middle layer 906 may be composed of a metal whose etch characteristics are such that higher energy ions than ion beam 912 provides are more appropriate for etching middle layer 906. A recipe for etching material of middle layer 906 may be prestored that indicates higher ion energy is to be used. Accordingly, when species sputtered from the middle layer 906 are detected, control settings of the processing apparatus such as extraction voltage may be automatically adjusted to generate higher energy ions, such as ion beam 914, as shown in FIG. 9B. In this example, control settings may be adjusted to generate the same mean angle and same beam current while increasing ion energy. Subsequently when etching of middle layer 906 is complete, a recipe for etching material of lower layer 908 may be retrieved that indicates still higher ion energy is to be used for etching lower layer 908. Accordingly, when species sputtered from the lower layer 908 are detected, control settings of the processing apparatus such as extraction voltage may be automatically adjusted to generate still higher energy ions, such as ion beam 916, as shown in FIG. 9C. In this example, control settings may be adjusted to generate the same mean angle and same beam current while increasing ion energy.

Figure 10:
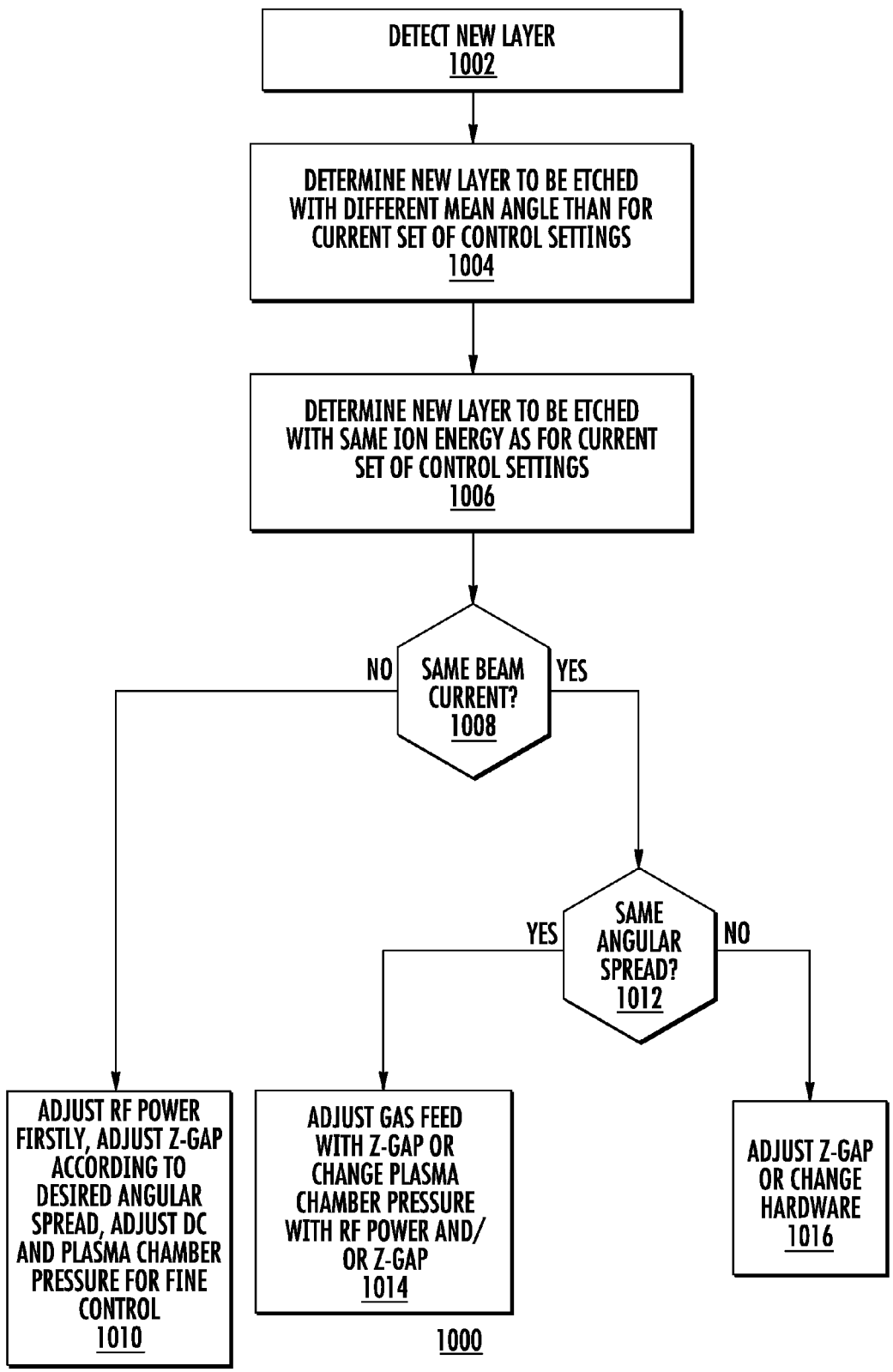
FIG. 10 depicts an exemplary fifth process flow.

FIG. 10 depicts an exemplary fifth process flow, process flow 1000, for implementing dynamic ion beam etching. A pictorial representation of one scenario for implementing the process flow 1000 is illustrated in FIGS. 12A-12C. At block 1002 a new layer is detected during etching of a layer stack. At block 1004, a determination is made that the new layer is to be etched with a different mean angle that that used for the current set of control settings. At block 1006, a determination is made that the new layer is to be etched with the same ion energy as that that used for the current set of control settings. At decision block 1008 a decision is made as to whether the new layer is to etched with the same beam current as that generated by the current set of control conditions. If not the flow proceeds to block 1010.

At block 1010, RF power is adjusted firstly. Subsequently, Z-gap is adjusted to generate a desired angular spread which may correspond to a target ion beam profile to be used to etch the new layer. The DC and plasma chamber pressure may be adjusted to achieve finer adjustment to the angular spread of the ion beam.

If, at decision block 1008, a determination is made that the same beam current is to be employed as that of the current set of control settings, the flow proceeds to decision block 1012. At decision block 1012 a determination is made as to whether the new layer is to etched with the angular spread as that generated by the current set of control conditions. If so the flow proceeds to block 1014.

At block 1014, the gas feed may be adjusted together with adjustment to the Z-gap. Alternatively, the plasma chamber pressure may be adjusted together with adjustment of RF power or adjustment to the Z-gap, or both.

If, at decision block 1012, the new layer is to be etched with a different angular spread, the flow proceeds to block 1016. At block 1016 the Z-gap is changed or hardware is changed.

Turning now to FIGS. 12A-12C there is shown a sequence of etch operations for etching patterned features into a substrate 1200 having a layer stack 1230. Mask features 1222 are provided upon the layer stack 1230 to define structures to be formed when ions are directed to the substrate to etch exposed portions of the layer stack 1230. In FIG. 12a, ion beam 1232 is directed to the substrate 1220. Control settings of a processing apparatus are set to provide an ion energy, mean angle, and ion current provided for ion beam 1232 that are appropriate for etching the top layer 1224. As etching using ion beam 1232 proceeds, the top layer 1224 may be removed, exposing middle layer 1226. The middle layer 1226 may be composed of a metal whose etch characteristics are such that higher angle ions than ion beam 1232 provides are more appropriate for etching middle layer 1226. A recipe for etching material of middle layer 1226 may be prestored that indicates higher mean angle and different beam current for etching middle layer 1226 is to be used. Accordingly, when species sputtered from the middle layer 1226 are detected, control settings of the processing apparatus such as RF power may be automatically adjusted to generate an ion beam having higher mean angle, such as ion beam 1234, as shown in FIG. 12B. In this example, control settings may be adjusted as shown in block 1010 to generate ions with the same ion energy, different beam current and different mean angle as suggested in FIG. 12B. Subsequently when etching of middle layer 1226 is complete, a recipe for etching material of lower layer 1228 may be retrieved that indicates still higher mean angle is to be used for etching lower layer 1228. Accordingly, when species sputtered from the lower layer 1228 are detected, control settings of the processing apparatus such as RF power may be automatically adjusted to generate an ion beam having a still higher mean angle, such as ion beam 1236, as shown in FIG. 12C. In this example, control settings may be adjusted as shown in block 1010 to generate an ion beam having the same ion energy, different beam current and still higher mean angle as suggested in FIG. 12C.

Figure 11:
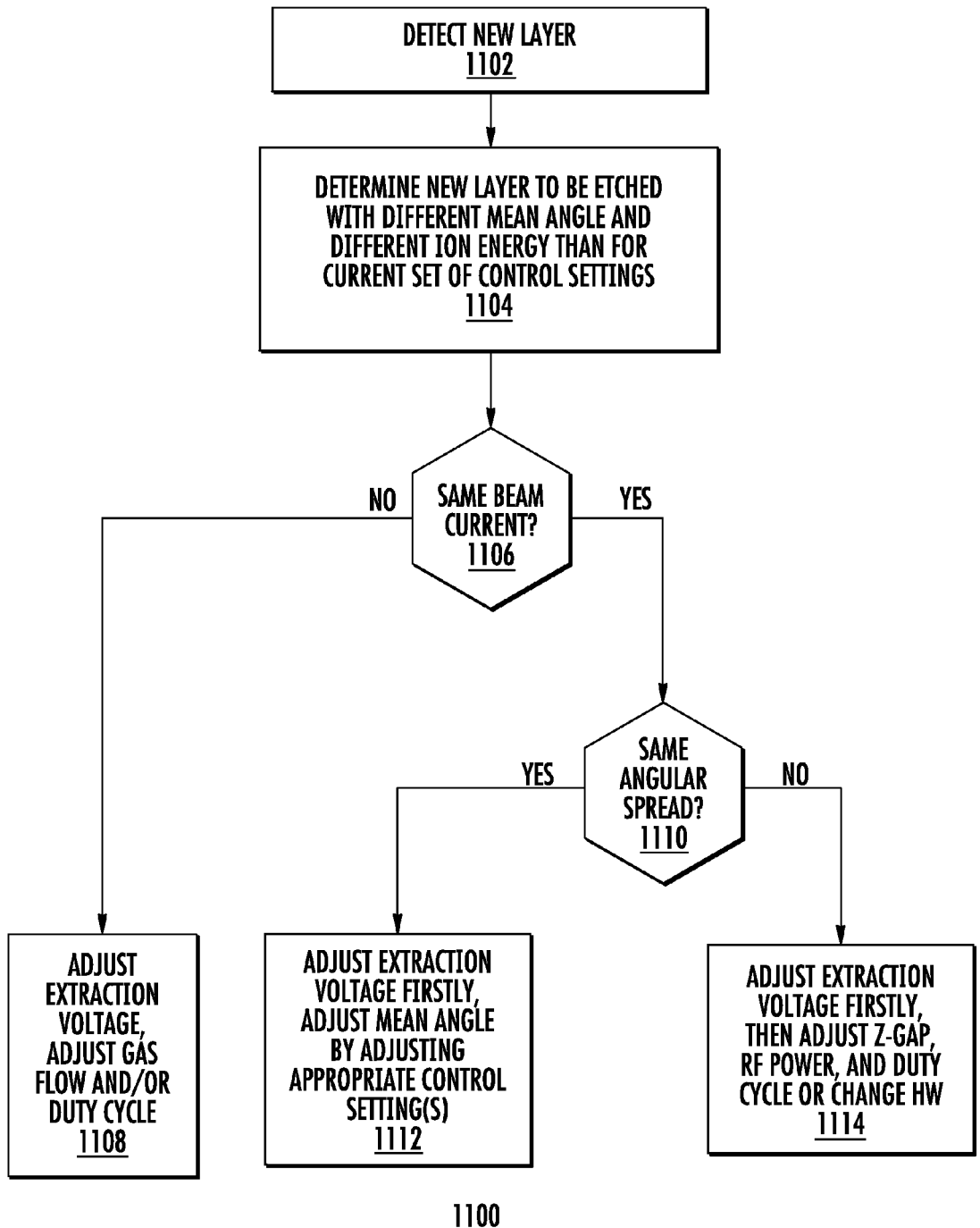
FIG. 11 depicts an exemplary sixth process flow.

FIG. 11 depicts an exemplary sixth process flow, process flow 1100, for implementing dynamic ion beam etching. A pictorial representation of one scenario for implementing the process flow 1100 is illustrated in FIGS. 12D-12F. At block 1102 a new layer is detected. At block 1104 it is determined that the new layer is to be etched using an ion beam having different mean angle and different ion energy that that produced by the current set of control settings.

At decision block 1106, a decision is made as to whether the new layer is to etched with the same beam current as that generated by the current set of control conditions. If not the flow proceeds to block 1108 where the extraction voltage is adjusted. The gas flow to a plasma chamber or ion beam duty cycle is adjusted, or both are adjusted, in order to adjust the beam current. If the same beam current is to be maintained the flow proceeds to decision block 1110.

At decision block 1110 a determination is made as to whether the new layer is to etched with the same angular spread as that generated by the current set of control conditions. If so the flow proceeds to block 1112. At block 1112, the extraction voltage of the processing apparatus is adjusted firstly. The mean angle is then adjusted by adjusting the appropriate control setting(s) such as the RF power applied to the plasma chamber.

If, at decision block 1110 a determination is made that angular spread of the ion beam to etch the new layer is to change, the flow proceeds to block 1114, where extraction voltage is firstly adjusted to change ion energy. Subsequently Z-gap, RF power, and Duty cycle may be adjusted to adjust the mean angle and angular spread of the ion beam while maintaining beam current.

Turning now to FIGS. 12D-12F there is shown a sequence of etch operations for etching patterned features into a substrate 1240 having a layer stack 1250. Mask features 1242 are provided upon the layer stack 1250 to define structures to be formed when ions are directed to the substrate to etch exposed portions of the layer stack 1250. In FIG. 12D, ion beam 1252 is directed to the substrate 1240. Control settings of a processing apparatus are set to provide an ion energy, mean angle, and ion current provided for ion beam 1252 that are appropriate for etching the top layer 1244. As etching using ion beam 1252 proceeds, the top layer 1244 may be removed exposing middle layer 1246. The middle layer 1246 may be composed of a metal whose etch characteristics are such that higher angle ions having a higher energy than ion beam 1252 provides are more appropriate for etching middle layer 1246. A recipe for etching material of middle layer 1246 may be prestored that indicates higher mean angle and different beam current for etching middle layer 1246 is to be used. Accordingly, when species sputtered from the middle layer 1246 are detected, control settings of the processing apparatus such as extraction voltage, RF power, and Z-gap may be automatically adjusted to generate an ion beam having higher mean angle, such as ion beam 1254, as shown in FIG. 12E. In this example, control settings may be adjusted to generate ions with a higher ion energy and higher mean angle as suggested in FIG. 12F. Subsequently when etching of middle layer 1246 is complete, a recipe for etching material of lower layer 1248 may be retrieved that indicates still higher mean angle and higher ion energy is to be used for etching lower layer 1248. Accordingly, when species sputtered from the lower layer 1248 are detected, control settings of the processing apparatus such as extraction voltage and RF power and may be automatically adjusted to generate an ion beam having a still higher ion energy and higher mean angle, such as ion beam 1256, as shown in FIG. 12F. In this example, control settings may be adjusted to generate an ion beam having still higher ion energy, still higher mean angle, and different angular spread.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of etching a substrate, comprising:
    directing a first ion beam to the substrate through an extraction plate of a processing apparatus using a first set of control settings of the processing apparatus;
    detecting a signal from the substrate that indicates a change in material being etched by the first ion beam from a first material to a second material;
    adjusting control settings of the processing apparatus to a second set of control settings different from the first set of control settings based on the second material; and
    directing a second ion beam to the substrate through the extraction plate using the second set of control settings, wherein the adjusting the control settings to the second set of control settings comprises:
        adjusting the control settings from the first set of control settings to a predetermined set of control settings associated with the second material;
        performing metrology to measure at least one parameter of an ion beam directed through the extraction plate using the predetermined set of control settings, the measured at least one parameter comprising ion energy, ion beam current and ion angular distribution; and
        adjusting the predetermined set of control settings to the second set of control settings based upon the measured at least one parameter of the ion beam.

2. The method of claim 1, wherein the substrate comprises:
    a layer stack comprising a plurality of layers on a substrate base; and
    a mask comprising a plurality of mask features that is disposed on the layer stack before the directing the first ion beam.

3. The method of claim 2, wherein the adjusting control settings comprises adjusting ion at least one control setting to adjust ion incidence angle between the first ion beam and second ion beam to account for differences in sputter etch characteristics of the first material and second material.

4. The method of claim 1 wherein the detecting the signal comprises receiving an optical emission spectroscopy (OES) signal generated by at least one element of the first material or second material.

5. The method of claim 4, wherein the detecting the signal comprises detecting an OES signal from different positions that are adjacent the substrate.

6. The method of claim 1, wherein the adjusting the control settings comprises adjusting at least one of: extraction voltage, RF power applied to a plasma chamber of the processing apparatus, separation between the substrate and the extraction plate, pressure of the plasma chamber, ion beam duty cycle for a pulsed ion beam, and scan speed applied to a substrate holder that holds the substrate.

7. The method of claim 1 wherein the adjusting the predetermined set of control settings comprises:
    comparing the at least one parameter of the ion beam to a target ion beam profile for the second material; and
    adjusting the control settings until the target ion beam profile is met.

8. The method of claim 1, further comprising:
    receiving an initial beam ion profile comprising at least one of: initial ion angle, initial ion energy, and initial ion current;
    in response to the receiving the initial ion beam profile, generating a preliminary ion beam using a preliminary set of control settings;
    performing metrology to measure the preliminary ion beam; and
    adjusting the preliminary set of control settings until the preliminary ion beam matches the initial ion beam profile.

9. The method of claim 8, wherein the adjusting the preliminary set of control settings comprises adjusting at least one of: extraction voltage, RF power applied to a plasma chamber of the processing apparatus, separation between the substrate and the extraction plate, pressure of the plasma chamber, duty cycle of a pulsed ion beam, and scan speed applied to a substrate holder that holds the substrate.

10. The method of claim 8, wherein the initial ion beam profile further comprises a substrate rotation increment, initial substrate orientation angle and substrate temperature.

11. The method of claim 1, wherein the substrate is a first substrate, the method further comprising:
    associating the second set of control settings with the second material;

detecting a signal from a layer stack of a second substrate during etching of the second substrate that indicates a change in material from the first material to the second material; and adjusting control settings of the processing apparatus to the second set of control settings.

12. The method of claim 1, wherein the first ion beam has a first ion angular distribution and the second ion beam has a second ion angular distribution that is different from the first ion angular distribution.

13. A method of etching a device structure, comprising:

providing a substrate comprising a layer stack disposed on a substrate base, the layer stack having a multiplicity of layers that includes at least one metal layer, and a mask having plurality of mask features disposed on the layer stack;

directing a first ion beam to the layer stack through an extraction plate of a processing apparatus using a first set of control settings of the processing apparatus;

detecting an optical emission spectroscopy (OES) signal from the layer stack that indicates a change in material being etched in the layer stack from a first material to a second material;

adjusting control settings of the processing apparatus to a second set of control settings different from the first set of control settings based on the second material; and directing a second ion beam to the layer stack through the extraction plate using the second set of control settings, wherein the adjusting the control settings to the second set of control settings comprises:

adjusting the control settings from the first set of control settings to a predetermined set of control settings associated with the second material;

performing metrology to measure at least one parameter of an ion beam directed through the extraction plate using the predetermined set of control settings, the measured at least one parameter comprising ion energy, ion beam current and ion angular distribution; and adjusting the predetermined set of control settings to the second set of control settings based upon the measured at least one parameter of the ion beam.

14. The method of claim 13, wherein the first ion beam has a first ion angular distribution and a first ion energy and the second ion beam has a second ion angular distribution and a second ion energy, wherein at least one of the first ion energy and first ion angular distribution differs from the second ion energy or second ion angular distribution, respectively.

15. The method of claim 13, wherein the adjusting the control settings comprises adjusting at least one of: extraction voltage, RF power applied to a plasma chamber of the processing apparatus, separation between the substrate and the extraction plate, pressure of the plasma chamber, ion beam duty cycle for a pulsed ion beam, and scan speed applied to a substrate holder that holds the substrate.

16. A processing apparatus comprising:

a plasma source to generate a plasma in a plasma chamber;

an extraction plate disposed along a side of the plasma chamber, the extraction plate having an aperture configured to direct an ion beam to a substrate when a bias is applied between the plasma chamber and substrate;

a monitoring apparatus to measure at least one signal from the substrate;

at least one computer-readable storage medium comprising instructions that, when executed, cause the processing apparatus to:

identify a first signal from the substrate that indicates a change in material from a first material to a second material when a first ion beam is directed to the substrate using a first set of control settings;

adjust control settings of the processing apparatus to a second set of control settings different from the first set of control settings based on the second material; and direct a second ion beam to the substrate through the extraction plate using the second set of control settings; and a substrate holder configured to scan the substrate along a first direction, wherein the ion beam comprises a pulsed ion beam, wherein the monitoring apparatus comprises a plurality of optical emission spectroscopy (OES) detectors arranged at a plurality of different positions with respect to a substrate along the first direction, wherein the first signal is a first OES signal that is detected at a first position of the plurality of positions, and wherein the at least one computer-readable storage medium comprises instructions that, when executed, cause the processing apparatus to:

receive a second OES signal from the substrate from a second position of the plurality of positions that is different from the first OES signal; and adjust an ion beam duty cycle of the pulsed ion beam during scanning of the substrate along the first direction in response to receipt of the first OES signal and second OES signal.

17. The processing apparatus of claim 16, wherein the at least one computer-readable storage medium comprises instructions that, when executed, cause the processing apparatus to:

adjust the control settings to a predetermined set of control settings associated with the second material;

perform metrology to measure at least one parameter of an ion beam directed through the extraction plate using the predetermined set of control settings, the measured at least one parameter comprising ion energy, ion beam current and ion angular distribution; and adjust the predetermined set of control settings to the second set of control settings based upon the measured at least one parameter of the ion beam.

18. The processing apparatus of claim 17, wherein the at least one computer-readable storage medium comprises instructions that, when executed, cause the processing apparatus to:

compare the measured at least one parameter of the ion beam to a target ion beam profile for the second material; and adjust the control settings until the target ion beam profile is met.

* * * * *